Aug. 12, 1958 P. DERBY ET AL 2,847,613

APPARATUS FOR DISPLACING MAGNETRON TUNER RESONANCES

Filed Jan. 9, 1956

INVENTORS
PALMER DERBY
HAROLD JACOBSON
JOHN L. TURNER
BY Wade Koontz
ATTORNEY and
James S. Shannon
AGENT United States Patent Office 2,847,613

Patented Aug. 12, 1958

2,847,613

APPARATUS FOR DISPLACING MAGNETRON TUNER RESONANCES

Palmer Derby, Weston, Harold Jacobson, Waltham, and John L. Turner, Needham, Mass., assignors to the United States of America as represented by the Secretary of the Air Force Application January 9, 1956, Serial No. 558,172

2 Claims. (Cl. 315—39.61)

This invention relates to magnetron vacuum tubes having multi-cavity resonating systems operating in the microwave region. Such a system has many possible resonant frequencies, or modes, only one of which, the $\pi$-mode, is normally utilized. One method of tuning a magnetron over a wide range of frequencies consists in inserting conducting material, in the form of tuning fingers, into the capacitive region of the cavities.

In this method of tuning, a major hurdle to be overcome is the elimination of tuner resonances. If each finger of the tuner could be supported independently of the others, there probably would be little trouble. But structurally it is feasible only to make them attached to a single piece. In this construction, the tuning structure becomes a multi-cavity resonator with cavities very similar to a magnetron. As the tuning structure's dimensions are of the same order of magnitude as those of the anode which it tunes, it is very likely that one or more of the tuner's resonant frequencies will be close to the $\pi$-mode frequency of the magnetron. As the tuning fingers enter the cavities of the anode and so tune them, in like manner the vanes forming the anode cavities are relatively moving into the spaces between the tuning fingers and are consequently tuning the tuning structure.

If at any position the resonant frequency of the tuner coincides with the $\pi$-mode frequency of the magnetron, power is dissipated in the tuner resonance. This is noted by a sharp drop in radio frequency power output delivered by the magnetron at this frequency.

The ordinary engineering approach to this problem is to modify the tuner geometry in such a way that the cross-over resonance is moved out of the $\pi$-mode tuning range. This technique is usually, but not always, successful.

The invention constitutes a new approach to the solution of this problem. Briefly, a ring is placed inside the magnetron anode in proximity to the outer diameter of the tuner. This ring increases the capacity of the tuner's cavities when the tuner is withdrawn from the anode. This lowers the resonant frequency of the tuner when it is in this position and consequently moves the crossover point toward the high frequency end and outside the magnetron tuning range as desired.

It is accordingly the object of this invention to provide means, in a tunable magnetron of the type described, to prevent common resonant frequencies of magnetron and tuner within the tuning range of the magnetron.

Figure 1:
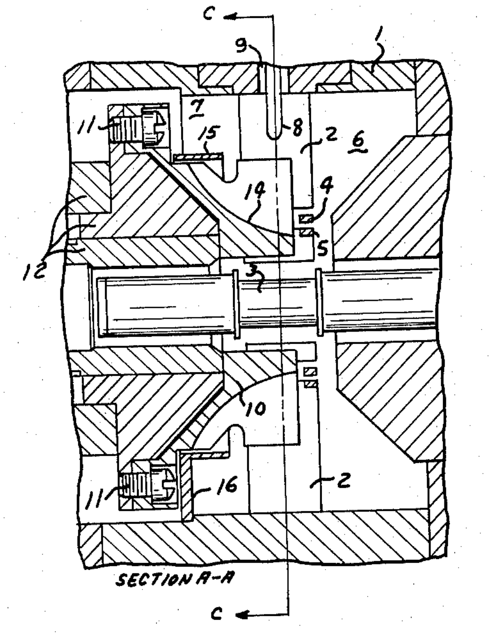
Figure 4:
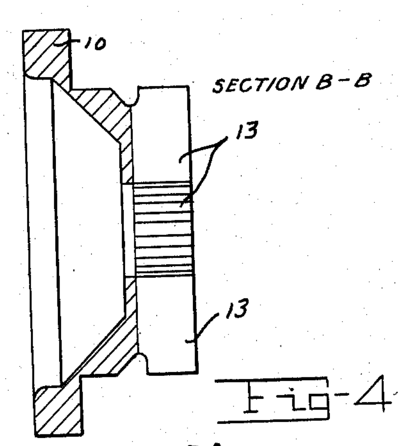
Figure 3:
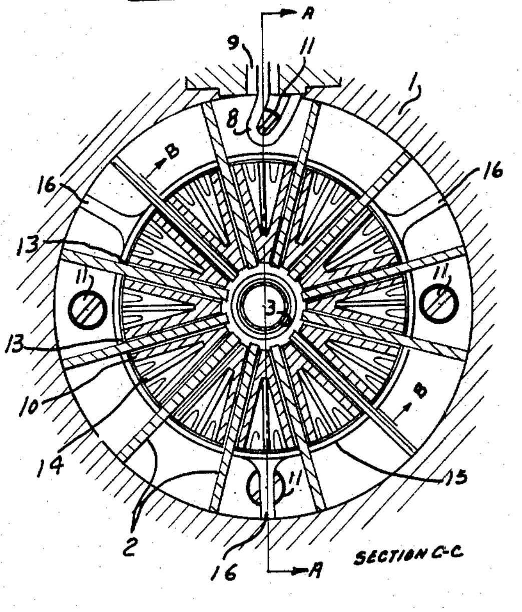
Figure 2:
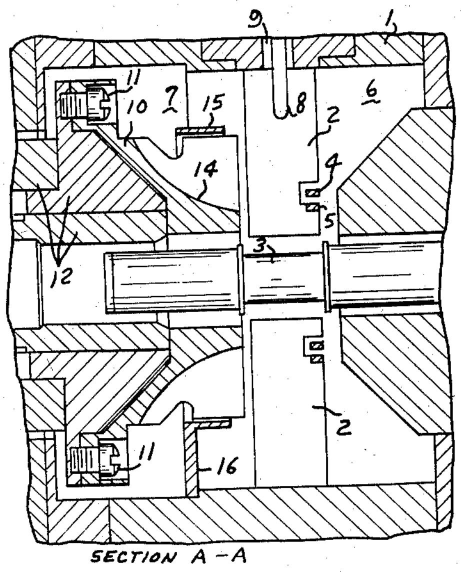

A more detailed description of the invention will be given in connection with the specific embodiment thereof shown in the accompanying drawings in which:

Fig. 1 is a cross section of the anode and tuner of a magnetron embodying the invention with the tuner in the extreme low frequency position, Fig. 2 is similar to Fig. 1 with the tuner in the extreme high frequency position, Fig. 3 is a transverse section of the anode and tuner, and Fig. 4 is a cross section of the tuner taken along the plane of a slot wall.

Referring to the drawing, 1 represents the anode block of a conventional magnetron having a number of equally spaced vanes 2 extending radially toward the electron emitting surface 3 of the magnetron cathode.

The vanes 2 form the resonant cavities of the magnetron. Alternate vanes are electrically tied together by ring straps 4 and 5 to restrict operation to the desired $\pi$-mode, in conventional manner. Coupling between the cavities takes place through straps 4 and 5 and magnetically through the end spaces 6 and 7 on either side of the vanes. Energy is removed from the resonant system by means of coupling loop 8 feeding coaxial transmission line 9.

The resonant system is tuned by a tuning crown 10 attached by screws 11 to a plunger assembly 12 which serves to move the tuning crown axially of the magnetron anode between its low frequency limit shown in Fig. 1 and its high frequency limit shown in Fig. 2.

The section of the tuning crown shown in Figs. 1 and 2 is taken along the line A—A of Fig. 3 and that shown in Fig. 4 is taken along line B—B of Fig. 3. The tuning crown is made of a non-magnetic metal and has a plurality of radial slots 13 cut therein to receive the vanes 2 of the anode as the crown is moved from the position shown in Fig. 1 to that shown in Fig. 2. The tuning is accomplished by the triangular fingers of metal between the slots, best seen in Fig. 3, which vary the capacities of the resonant cavities as they enter. Excess metal in the tuning fingers is removed by a milling cutter, the bottom of the cut being at 14.

In a tuner of the type described above, the slots 13 in themselves form cavities which have dimensions of the same order of magnitude as the anode cavities and therefore may have one or more resonant frequencies close to the $\pi$-mode frequency of the magnetron.

As the fingers of the tuner move into the cavities of the anode and vary their resonant frequency the vanes of the magnetron anode move at the same time into the slots 13 of the tuner and similarly vary the resonant frequency of the slots. In a magnetron of the desired type, it is very likely that the resonant frequencies of the tuner and magnetron will coincide at some point within the tuning range and thus seriously impair the magnetron output at that frequency.

The above condition is prevented in accordance with the invention by the addition of a cylindrical ring 15 which surrounds and is in proximity to the tuner 10. The ring has three extensions 16, best seen in Fig. 3, which accurately center it within the anode block of the magnetron. As the tuner is withdrawn from the magnetron cavities, both the magnetron frequency and the tuner resonant frequency increase. However, as the tuner is withdrawn, ring 15 acts to increase the capacity in the tuner cavities formed by slots 13 and thus lower the resonant frequency below what it would be without the ring. This lowering of tuner resonance is sufficient to prevent tuner resonance occurring at any frequency to which the magnetron is tuned.

We claim:

1. In combination with a magnetron of the type having an anode block containing a plurality of radial vanes forming the resonant cavities of the magnetron and having a movable tuner for capacitively tuning said cavities, in which said tuner consists of a block of radial metal having a plurality of slots adapted to receive said vanes without electrical contact, in which means are provided for provided for moving said tuner from a low frequency position in which said vanes substantially fill said slots to a high frequency position in which said vanes are wholly outside said slots for tuning said magnetron over a predetermined frequency range, and in which said slots inherently constitute resonant cavities inherently tuned by said vanes: means for adding an increasing amount of capacity to said slot cavities as said tuner moves from said low frequency position to said high frequency position, said means comprising a conductive element surrounding said tuner and having a surface in proximity thereto, said surface having a dimension in the direction of movement of said tuner at least approximating the depth of said slots, said element being fixed relative to said vanes and being positioned so that said surface covers an increasing portion of the outer ends of said slots as said tuner moves from said low frequency position to said high frequency position.

2. In combination with a magnetron of the type having an anode block containing a cylindrical cavity, a plurality of vanes extending from the wall of said cylindrical cavity toward its axis and defining the resonant cavities of said magnetron, a capacitive tuner concentric with said axis and consisting of a circular block of metal having slots therein radial with respect to said axis and adapted to receive said vanes without electrical contact, and means for axially moving said tuner from a low frequency position in which said vanes substantially fill said slots to a high frequency position in which said vanes are wholly outside said slots for tuning said magnetron over a predetermined frequency range, and in which said slots inherently constitute resonant cavities inherently tuned by said vanes: means for adding an increasing amount of capacity to said slot cavities as said tuner moves from said low frequency position to said high frequency position, said means comprising a conductive element surrounding said tuner and having an inner cylindrical surface concentric with said axis and in proximity to said tuner, said surface having an axial dimension at least approximating the depth of said slots, said element being fixed relative to said vanes and being positioned so that said surface covers an increasing portion of the outer ends of said slots as said tuner moves from said low frequency position to said high frequency position.

References Cited in the file of this patent

UNITED STATES PATENTS

| | | |
|---|---|---|
| 2,450,619 | Sonkin | Oct. 5, 1948 |
| 2,508,576 | Kusch | May 23, 1950 |
| 2,714,178 | Kather | July 26, 1955 |
| 2,733,381 | Geier | Jan. 31, 1956 |